United States Patent
Sun et al.

(10) Patent No.: US 9,647,703 B2
(45) Date of Patent: May 9, 2017

(54) MULTI-BAND DEVICE WITH REDUCED BAND LOADING

(71) Applicant: Skyworks Solutions, Inc., Woburn, MA (US)

(72) Inventors: Weimin Sun, Santa Rosa Valley, CA (US); David Viveiros, Jr., Thousand Oaks, CA (US); Russ Alan Reisner, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/855,103

(22) Filed: Sep. 15, 2015

(65) Prior Publication Data

US 2016/0080011 A1  Mar. 17, 2016

Related U.S. Application Data

(60) Provisional application No. 62/051,191, filed on Sep. 16, 2014.

(51) Int. Cl.
| | |
|---|---|
| *H01Q 11/12* | (2006.01) |
| *H04B 1/04* | (2006.01) |
| *H04B 1/00* | (2006.01) |
| *H03F 1/56* | (2006.01) |
| *H03F 3/24* | (2006.01) |

(52) U.S. Cl.
CPC ........... *H04B 1/0475* (2013.01); *H03F 1/565* (2013.01); *H03F 3/24* (2013.01); *H04B 1/005* (2013.01); *H04B 1/0458* (2013.01); *H04B 1/0483* (2013.01); *H03F 2200/111* (2013.01); *H04B 2001/0408* (2013.01)

(58) Field of Classification Search
CPC .... H04B 1/006; H04B 1/0458; H04B 1/0483; H04B 1/0475; H04B 7/0602
USPC .................................................. 455/120–129
See application file for complete search history.

(56) References Cited

U.S. PATENT DOCUMENTS

| | | | |
|---|---|---|---|
| 6,298,244 B1 | 10/2001 | Boesch et al. | |
| 6,332,071 B1 * | 12/2001 | Brandt ...................... | H01P 1/15 333/101 |
| 6,496,708 B1 * | 12/2002 | Chan ....................... | H03H 7/461 330/126 |
| 6,625,470 B1 | 9/2003 | Fourtet et al. | |
| 7,925,227 B2 * | 4/2011 | Ichitsubo ................. | H04B 1/44 455/114.1 |
| 8,000,737 B2 | 8/2011 | Caimi et al. | |
| 8,248,179 B2 * | 8/2012 | Takahashi ................. | H01P 1/36 333/1.1 |

(Continued)

FOREIGN PATENT DOCUMENTS

| | | |
|---|---|---|
| WO | WO 01/28149 | 4/2001 |
| WO | WO 01/28164 | 4/2001 |

*Primary Examiner* — Simon Nguyen
(74) *Attorney, Agent, or Firm* — Knobbe, Martens, Olson & Bear, LLP

(57) ABSTRACT

In an embodiment, an apparatus includes a first radio frequency (RF) signal path and a second RF signal path. The first RF signal path can provide a first RF signal when active and the second RF signal path can provide a second RF signal when active. The second RF signal path can include a matching network with a load impedance configured to prevent a resonance in the second RF signal path due to coupling with the first RF signal path when the first RF signal path is active.

23 Claims, 10 Drawing Sheets

(56) References Cited

U.S. PATENT DOCUMENTS

| | | |
|---|---|---|
| 8,565,813 B2 | 10/2013 | Kim |
| 8,649,741 B2 | 2/2014 | Iijima et al. |
| 8,725,085 B2 * | 5/2014 | Darabi ............... H04B 1/525 |
| | | 455/130 |
| 8,860,525 B2 | 10/2014 | Manssen et al. |
| 8,971,830 B2 | 3/2015 | Hadjichristos et al. |
| 2003/0022638 A1 | 1/2003 | Imai et al. |
| 2003/0117219 A1 * | 6/2003 | Yamamoto ........... H03F 1/302 |
| | | 330/295 |
| 2004/0203552 A1 | 10/2004 | Horiuchi et al. |
| 2006/0270367 A1 * | 11/2006 | Burgener ............ H01Q 23/00 |
| | | 455/127.1 |
| 2008/0136554 A1 * | 6/2008 | He ..................... H03F 1/526 |
| | | 333/101 |
| 2008/0136559 A1 | 6/2008 | Takahashi et al. |
| 2008/0204163 A1 * | 8/2008 | Royak .............. H01P 1/20345 |
| | | 333/132 |
| 2009/0180403 A1 | 7/2009 | Tudosoiu |
| 2010/0178879 A1 | 7/2010 | Sato et al. |
| 2010/0291888 A1 | 11/2010 | Hadjichristos et al. |
| 2011/0116423 A1 * | 5/2011 | Rousu ................. H01Q 1/242 |
| | | 370/297 |
| 2011/0222443 A1 * | 9/2011 | Khlat .................. H03F 3/189 |
| | | 370/277 |
| 2011/0294443 A1 * | 12/2011 | Nohra .................. H04B 1/48 |
| | | 455/78 |
| 2013/0113575 A1 * | 5/2013 | Easter ................... H01P 1/15 |
| | | 333/103 |
| 2013/0176913 A1 * | 7/2013 | Niskanen ............. H04B 1/48 |
| | | 370/278 |
| 2013/0278477 A1 * | 10/2013 | Dupuy .................. H01Q 1/50 |
| | | 343/852 |
| 2014/0009208 A1 | 1/2014 | Smith |
| 2014/0043203 A1 | 2/2014 | Sabouri |
| 2014/0287794 A1 * | 9/2014 | Akhi ................... H04B 1/525 |
| | | 455/550.1 |
| 2015/0091776 A1 * | 4/2015 | Gaynor ............. H03K 17/693 |
| | | 343/860 |
| 2015/0270813 A1 * | 9/2015 | Morshedi ............. H04B 17/19 |
| | | 455/144 |
| 2015/0349770 A1 * | 12/2015 | Bakalski .............. H03K 17/16 |
| | | 455/78 |
| 2015/0357989 A1 * | 12/2015 | Ma ....................... H03H 7/38 |
| | | 455/572 |
| 2016/0080011 A1 | 3/2016 | Sun et al. |

* cited by examiner

MULTI-BAND DEVICE WITH REDUCED BAND LOADING

CROSS-REFERENCE TO RELATED APPLICATIONS

This application claims the benefit of priority under 35 U.S.C. §119(e) of U.S. Provisional Patent Application No. 62/051,191, filed Sep. 16, 2014 and titled "MULTI BAND DEVICE WITH REDUCED BAND LOADING," the disclosure of which is hereby incorporated by reference in its entirety herein. This application is also related to U.S. patent application Ser. No. 14/855,141 filed on even date herewith and titled "MULTI-BAND DEVICE HAVING SWITCH WITH INPUT SHUNT ARM," the disclosure of which is hereby incorporated by reference in its entirety herein.

BACKGROUND

Technical Field

This disclosure relates to electronic systems and, in particular, to radio frequency (RF) circuits.

Description of the Related Technology

A large number of mobile devices are supporting communications within multiple frequency bands, such as frequency bands defined by a Long Term Evolution (LTE) standard. A radio frequency (RF) signal path associated with one frequency band can be active while another RF signal path associated with another frequency band can be non-active. For instance, each signal path can include a power amplifier configured to provide an RF signal within a different frequency band, an associated matching network, and an associated select switch. In this example, when a power amplifier of a first RF signal path is active, it can provide a relatively high powered RF signal to a select switch by way of a matching network. As components for mobile devices are being miniaturized, it can be more difficult to isolate signals from different RF signal paths and coupling from one signal path to another can result in insertion loss in an active RF signal path.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an apparatus that includes a first radio frequency (RF) signal path and a second RF signal path. The RF signal path is configured to provide a first RF signal when active. The second RF signal path is configured to provide a second RF signal when active. The second RF signal path includes a matching network with a load impedance configured to prevent a resonance in the second RF signal path due to coupling with the first RF signal path when the first RF signal path is active.

The load impedance of the matching network can prevent the resonance in the second RF signal path due to coupling with the first RF signal path when the second RF signal path is non-active and the first RF signal path is active. The resonance can be an LC resonance of the matching network. The first RF signal and the second RF signal can be in different frequency bands.

The first RF signal path can include a first power amplifier configured to provide the first RF signal and the second RF signal path can include a second power amplifier configured to provide the second RF signal.

The second RF signal path can include a select switch configured to selectively provide the second RF signal to an output of the second RF signal path. The select switch can be a multi-throw switch. Each of the throws of such a multi-throw switch can include a switch arm and a shunt arm electrically coupled to the respective switch arm. In an embodiment, the select switch can have a selected switch arm on and a selected shunt arm on when the second RF signal is non-active and the first RF signal path is active, in which the impedance from the selected switch arm and the selected shunt arm being on can contribute to the load impedance. In an embodiment, the load impedance can include an input shunt arm and passive impedance element in series between input of select switch and ground. The passive impedance element can be, for example, a resistor. According to an embodiment, the load impedance can include a shunt capacitor having a first end and a second end, the first end electrically coupled to an input of the select switch, and the second end electrically coupled to a ground potential.

Another aspect of this disclosure is an apparatus that includes a first transmission path and a second transmission path. The first transmission path includes a first power amplifier configured to provide a first RF signal, a first matching network, and a first multi-throw switch configured to receive the first RF signal by way of the first matching network. The second transmission path includes a second power amplifier configured to provide a second RF signal that is within a different frequency band than the first RF signal, a second matching network, and a second multi-throw switch configured to receive the second RF signal by way of the second matching network. The second multi-throw switch has an input impedance configured to prevent a resonance in the second transmission path due to coupling with the first transmission path when the first transmission path is active.

The input impedance of the second multi-throw switch can include a passive impedance element in series with an input shunt arm. The passive impedance element can include a resistor.

The input impedance of the second multi-throw switch can include a shunt capacitor.

The second multi-throw switch can implement at least a portion of the input impedance by having both a switch arm and a shunt arm corresponding to a selected throw on when the second multi-throw switch is in a non-active state.

Another aspect of this disclosure is apparatus that includes an amplifier configured to amplify a radio frequency (RF) signal, a matching network coupled to an output of the amplifier, and a select switch in communication with the amplifier by way of the matching network. The select switch is configured to electrically couple an input of the select switch to a selected output path in an active state. The select switch has an input impedance in a non-active state to prevent a resonance on the matching network due to coupling to another RF signal path from developing when the select switch is in the non-active state and the amplifier is deactivated.

The matching network can include capacitors and inductors. The select switch can be a multi-throw switch having a shunt arm and a switch arm corresponding to each of the throws. Each of the throws of the multi-throw switch can be associated with different frequency bands. The select switch can have both the switch arm and the shunt arm corresponding to a selected throw on when the select switch is in the non-active state. A switch control circuit can provide control signals to the select switch to set the select switch in the non-active state.

The select switch can include an input shunt arm at the input of the select switch, in which the input shunt arm is configured to be on when the select switch is in the non-active state. A passive impedance element can be in series with the input shunt arm between the input of the select switch and a ground potential.

The apparatus can include a shunt capacitor having a first end and a second end, the first end coupled to the input of the select switch, and the second end coupled to a ground potential.

The amplifier can be a power amplifier. The apparatus can be configured as a power amplifier module that includes a first path configured to provide an RF signal in a first defined frequency band and a second path configured to provide an RF signal in a second defined frequency band, in which the first path includes the power amplifier, the matching network, and the select switch. The first path can be deactivated when the second path is activated. The second path can include a second power amplifier, a second matching network coupled to an output of the second amplifier, and a second select switch in communication with the second power amplifier by way of the second matching network. The second select switch can have a second input impedance when the second select switch is in a non-active state to prevent a second standing wave from developing when the second select switch is in the non-active state.

Another aspect of this disclosure is an apparatus that includes an amplifier configured to amplify a radio frequency (RF) signal, a matching network coupled to an output of the amplifier, and a multi-throw switch in communication with the amplifier by way of the matching network. The multi-throw switch is configured to have both a switch arm and a shunt arm associated with a selected throw on in a non-active state.

Another aspect of this disclosure is an apparatus that includes a first transmission path and a second transmission path. The first transmission path includes a first power amplifier configured to provide a first RF signal, a first matching network, and a first multi-throw switch configured to receive the first RF signal by way of the first matching network. The second transmission path includes a second power amplifier configured to provide a second RF signal that is within a different frequency band than the first RF signal, a second matching network, and a second multi-throw switch configured to receive the second RF signal at an input by way of the second matching network. The second multi-throw switch has a passive impedance element in series with an input shunt arm between the input of the multi-throw switch and a ground potential.

The passive impedance element can include a resistor. When the shunt arm is on, a combined impedance of the passive impedance element and the shunt arm can be approximately 50 Ohms at a fundamental frequency of the first RF signal.

The input shunt arm can be on when the second transmission path is in an active state. The input shunt arm can be on when the first transmission path is in an active state.

The apparatus can be configured as a module that includes a package enclosing the first and second transmission paths. Such a module can be a power amplifier module and/or a multi-chip module. The apparatus can be configured as a mobile device that includes the first and second transmission paths and an antenna, in which the antenna configured to transmit the first RF signal when the first transmission path is in an active state.

Another aspect of this disclosure is an apparatus that includes a first radio frequency (RF) signal path and a second RF signal path. The first RF signal path is configured to provide a first RF signal when active. The second RF signal path is configured to provide a second RF signal when active. The second RF signal path includes a select switch having an input shunt arm electrically coupled to an input of the select switch. The input shunt arm is configured to be on when the first RF signal path is active and the second RF signal path is inactive.

The input shunt arm can be in series with a passive impedance element between the input of the select switch and a ground potential. The passive impedance element can include resistor. The second RF signal path can include a power amplifier configured to generate the second RF signal when the second RF signal path is active and a matching network configured to provide the second RF signal to the select switch. The first RF signal and the second RF signal can be in different frequency bands. The apparatus can be configured as an electronic component for a mobile device.

Another aspect of this disclosure is an apparatus that includes an amplifier configured to amplify a radio frequency (RF) signal, a matching network coupled to an output of the amplifier, and a multi-throw switch in communication with the amplifier by way of the matching network. The multi-throw switch has an input shunt arm electrically coupled to an input of the multi-throw switch. The input shunt arm is configured to be on when the multi-throw switch is in a non-active state.

The input shunt arm can be in series with a passive impedance circuit between the input of the multi-throw switch and a ground potential. The passive impedance circuit can be a resistor. The passive impedance element can be in series between the input shunt arm and the input of the multi-throw switch.

The multi-throw switch can include at least four throws. The amplifier can be a power amplifier.

The apparatus can further include another RF signal path that includes a second amplifier and a second multi-throw switch configured to receive a second RF signal from the second amplifier by way of a second matching network, in which the other RF signal path provides coupling to the matching network.

Another aspect of this disclosure is an apparatus that includes an amplifier configured to amplify a radio frequency (RF) signal, a matching network coupled to an output of the amplifier, and a multi-throw switch in communication with the amplifier by way of the matching network. The multi-throw switch has a shunt capacitor at an input of the multi-throw switch.

Another aspect of this disclosure is an apparatus that includes a first path configured to provide a first radio frequency (RF) signal, and a second path configured to provide a second RF signal. The second RF signal is within a different frequency band than the first RF signal. The second path is configured to be deactivated when the first path is activated. The second path includes a select switch configured to selectively provide the second RF signal to an output. The select switch has an input impedance when the second path is deactivated to prevent a standing wave from developing when the second path is deactivated and the first path is activated.

Another aspect of this disclosure is an apparatus that includes an amplifier configured to amplify a radio frequency (RF) signal, a matching network coupled to an output of the amplifier, the matching network including at least one capacitor and at least one inductor, and a select switch in communication with the amplifier by way of the matching network. The select switch has an input load configured to reduce an LC resonance of the matching network when the select switch is in a non-active state.

Another aspect of this disclosure is an apparatus that includes a first path configured to provide a radio frequency (RF) signal and a second path configured to be non-active when the first path is active. The second path includes a matching network with a load impedance configured to prevent a resonance in the second path due to coupling with the first path when the second path is non-active and the first path is active.

Another aspect of this disclosure is an apparatus that includes a first path configured to provide a first radio frequency (RF) signal and a second path configured to provide a second RF signal. The second path includes a matching network with a load impedance configured to prevent a resonance in the second path due to coupling from the first path when the second path and the first path are both active.

The matching network can be an LC network. The resonance can be an LC resonance of the matching network.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 6A is a schematic diagram of an active band and a non-active band with a shunt with a shunt switch in series with a passive impedance circuit at an input of a band select switch according to an embodiment.

DETAILED DESCRIPTION OF CERTAIN EMBODIMENTS

Figure 1:
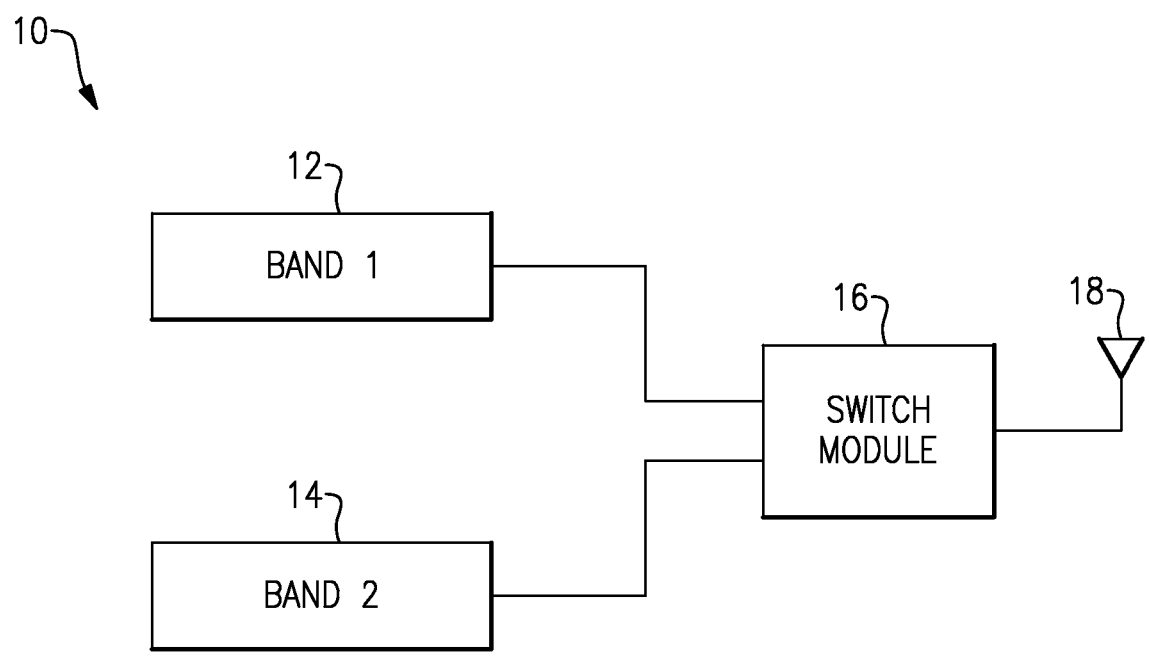
FIG. 1 is a schematic block diagram of a front end architecture having transmission paths for a plurality of frequency bands.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The deployment of mobile communication standards, such as Long Term Evolution (LTE), worldwide has provided a desire to have mobile devices support communications over more and more frequency bands. Within the limited physical space of a front end module, band to band isolation is becoming more difficult to implement. In certain power amplifier (PA) front end modules, dual band block designs have been adopted for relatively easy routing with a minimal footprint. Front end modules in mobile devices that support communications over several frequency bands can be built from several dual band blocks due to limited available physical space and relative ease of integration.

In such a dual band PA, one band can be active and transmitting a relatively high power signal while the other band can be non-active (e.g., shut off by a switch). As used herein, "active band" can refer to circuitry of an RF signal path that is in an active state and providing an RF signal within a defined frequency band. As used herein, "non-active band" can refer to circuitry of an RF signal path that is a non-active state and not providing an RF signal. The non-active band can pick up signals from the active band due to coupling between the two bands. Such a band to band coupling can also be referred to as band loading. Band loading is one problem in a multi-band PA design, such as a dual band PA design. Band loading can involve the existence of one or more non-active bands in a relatively close proximity in frequency to an active band that cause energy losses in the active pass band, such as active pass band suck out. For instance, when operating at a frequency where the non-active band PA output path can form a standing wave resonance, the active band can couple non-trivial energy into the non-active band. This can lead to energy suck out in the active band. Band loading can thus impact the insertion loss of the active band.

In an illustrative example, a PA output matching network can be connected to a band select switch. The band select switch input impedance for a non-active state, which can also be referred to as an off state, can provide a high impedance which can allow a standing wave to exist on this non-active band PA output path. When the standing wave is formed, it can suck out energy from the active band and cause band loading on the active band.

Band loading can be reduced by keeping a relatively large physical distance between circuitry of the active band and circuitry of a non-active band. Band loading can also be reduced by shielding circuitry of one band from circuitry of another band. Such approaches typically consume extra physical space. This can undesirably increase the size and/or footprint of a module. In turn, the increased size and/or footprint can make it difficult and/or unfeasible to integrate circuitry for more bands into one mobile device.

Aspects of this disclosure relate to providing a non-active band load impedance to reduce or eliminate band loading without significantly impacting other PA performance parameters. A non-open impedance at the non-active band load side can be provided to reduce reflection from the load. This can damp a standing wave amplitude in a non-active band and thereby avoid suck out in the active band. The non-open impedance can be achieved a variety of ways, such as with an off-state switch input impedance, with dedicated switch logic, with a relatively small shunt capacitor at the non-active band load, or any combination thereof. Such non-active band load impedance control can be used in a wide variety of products.

Embodiments discussed herein relate to providing a select switch input impedance that can prevent (e.g., reduce and/or eliminate) standing waves in a non-active path, such as a non-active band path. When the non-active band PA output load or the select switch input impedance is relatively matched, standing waves should not be sustained and the band loading should be resolved. Several approaches to modify the select switch input impedance for the non-active band are discussed herein. In these approaches, a shunt path can be provided to the select switch input. In one embodiment, the select switch logic state of all-off can leave one switch arm on and the switch input impedance can be at a value, such as a value selected from the range from about 10 Ohms to 30 Ohms, such that the load impedance should not sustain the standing wave in the non-active band PA output path. More details regarding this embodiment will be discussed with reference to FIG. 3A. In some other embodiments, one shunt arm can be added to the select switch input side. In a non-active all-off state, the added shut arm can be on and force the select switch input impedance to a value, such as a value selected from the range from about 10 Ohms to 30 Ohms, that should not sustain a standing wave on the non-active PA output path. The added input shunt arm can be arranged in series with a resistor or a passive impedance circuit. More details regarding these embodiments will be discussed with reference to FIGS. 4A and 6A. In another embodiment, a relatively small shunt capacitor, such as a shunt capacitor having a capacitance selected from the range from about 2 pF to 8 pF, can be included at an input of the select switch. The added shunt capacitor should turn the standing wave wavelength and shift the suck out notch out of the active pass band. More details regarding this embodiment will be discussed with reference to FIG. 5A.

Embodiments discussed herein can advantageously modify the non-active band PA output load impedance instead of physically separating transmission paths associated with different bands or using the ground plane to shield transmission paths associated with different bands from each other. Modifying the PA output off-state load impedance in accordance with the principles and advantages discussed herein can reduce and/or eliminate band loading issues that can occur in compact PA modules.

While preventing a resonance, such as a standing wave resonance, in a non-active band is discussed herein in connection with certain embodiments for illustrative purposes, it will be understood that the principles and advantages discussed herein can be applied to reduce or eliminate a resonance in any circuit in a non-active path that can experience coupling from an active path, such as an active band path. Modifying a load impedance of a matching network for the non-active path can reduce and/or eliminate such resonances.

FIG. 1 is a schematic block diagram of a front end architecture 10 having transmission paths for a plurality of frequency bands. These transmission paths can be RF signal paths. The illustrated front end architecture includes a first transmission path 12, a second transmission path 14, a switch module 16, and an antenna 18. The front end architecture 10 can include more elements than illustrated in FIG. 1 and/or some embodiments can include a subset of the illustrated elements. Although the front end architecture 10 may be described with reference to two transmission paths, it will be understood that the principles and advantages discussed herein can be applied to front end architectures having three or more transmission paths.

The first transmission path 12 and the second transmission path 14 can be configured to provide radio frequency (RF) signals within different defined frequency bands. An RF signal can have a frequency in the range from about 30 kHz to 300 GHz, such as in a range from about 450 MHz to about 4 GHz for radio frequency signals in Long Term Evolution systems. The different frequency bands can be frequency bands defined by an LTE standard. The different frequency bands can be non-overlapping in frequency. In an illustrative example, the first transmission path 12 can be a high band path and the second transmission path 14 can be a low band path. The first transmission path 12 can generate RF signals within defined sub-bands of the defined frequency band of the first transmission path 12. The second transmission path 14 can generate RF signals within defined sub-bands of the defined frequency band of the second transmission path 14. One of the first transmission path 12 and the second transmission path 14 can be activated while the other can be non-active.

The switch module 16 can selectively electrically couple an RF signal from the first transmission path 12 or the second transmission path 14 to the antenna 18. The switch module 16 can also selectively provide an RF signal from a selected sub-band of the first transmission path 12 or the second transmission path 14 to the antenna 18. The switch module 16 can include filters each configured to pass a particular frequency band in an electrical path to the antenna 18. Such filters can be band pass filters. The switch module 16 can create a signal path in which a filter associated with the selected frequency band is included between the first transmission path 12 or the second transmission path 14 and the antenna 18. The switch module 16 can also serve to electrically couple the antenna 18 to a selected receive path (not illustrated). In such instances, duplexers with transmit and receive filters can be included in the switch module 16.

Figure 2A:
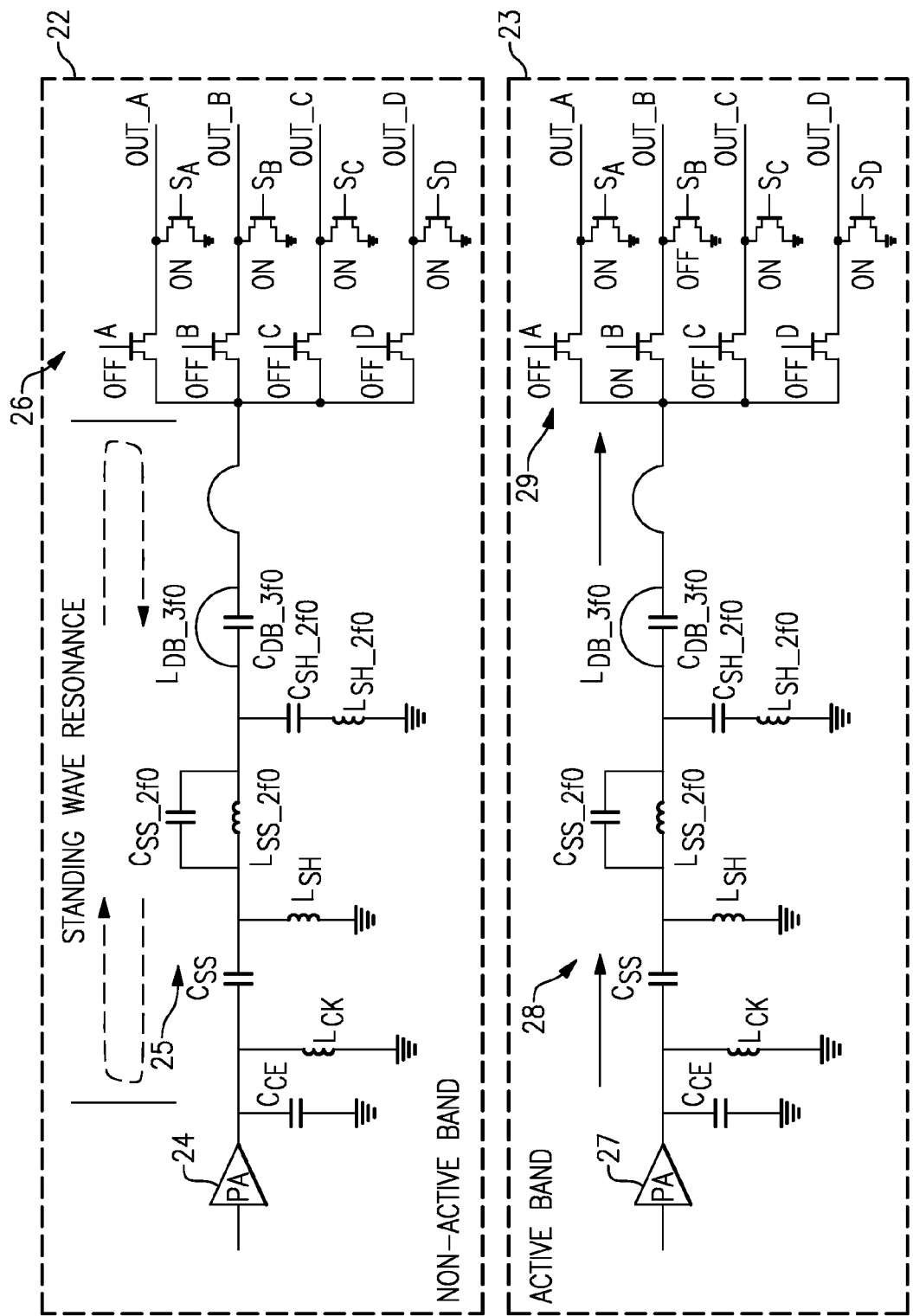
FIG. 2A is a schematic diagram of an active band and a non-active band with a standing wave resonance.

FIG. 2A is a schematic diagram of an active band and a non-active band with a standing wave resonance. FIG. 2A illustrates a transmission path 22 for the non-active band and a separate transmission path 23 for the active band. Both of these transmission paths can be included in RF signal paths. It will be understood that the active band and the non-active band can be switched during operation of an electronic device that includes the transmission paths 22 and 23. The transmission path 22 for the non-active band can include a power amplifier 24, a matching network 25, and a band select switch 26. The transmission path 22 for the non-active band can correspond to the first transmission path 12 of FIG. 1 and a portion of the switch module 16 of FIG. 1. The transmission path 23 for the active band can include a power amplifier 27, a matching network 28, and a band select switch 29. The power amplifier 27 can provide an RF signal within a different frequency band than an RF signal provided by the power amplifier 24. In addition, the matching network 28 can provide impedance matching for different frequencies than the matching network 25. Accordingly, one or more passive impedance elements of the matching network 28 can have a different capacitance or inductance than a corresponding passive impedance element in the matching network 25. According to some other embodiments (not illustrated), the matching networks for different bands can have different circuit topologies and/or can provide different filtering functions. The transmission path 23 for the active band can correspond to the second transmission path 14 of FIG. 1 and a portion of the switch module 16 of FIG. 1.

Coupling between the transmission path 23 for the active band and the transmission path 22 for the non-active band illustrated in FIG. 1 can create a standing wave resonance on the non-active band while the active band transmits a RF signal. This standing resonance can lead to band loading and thereby increase the insertion loss of the transmission path 23 for the active band.

Figure 2B:
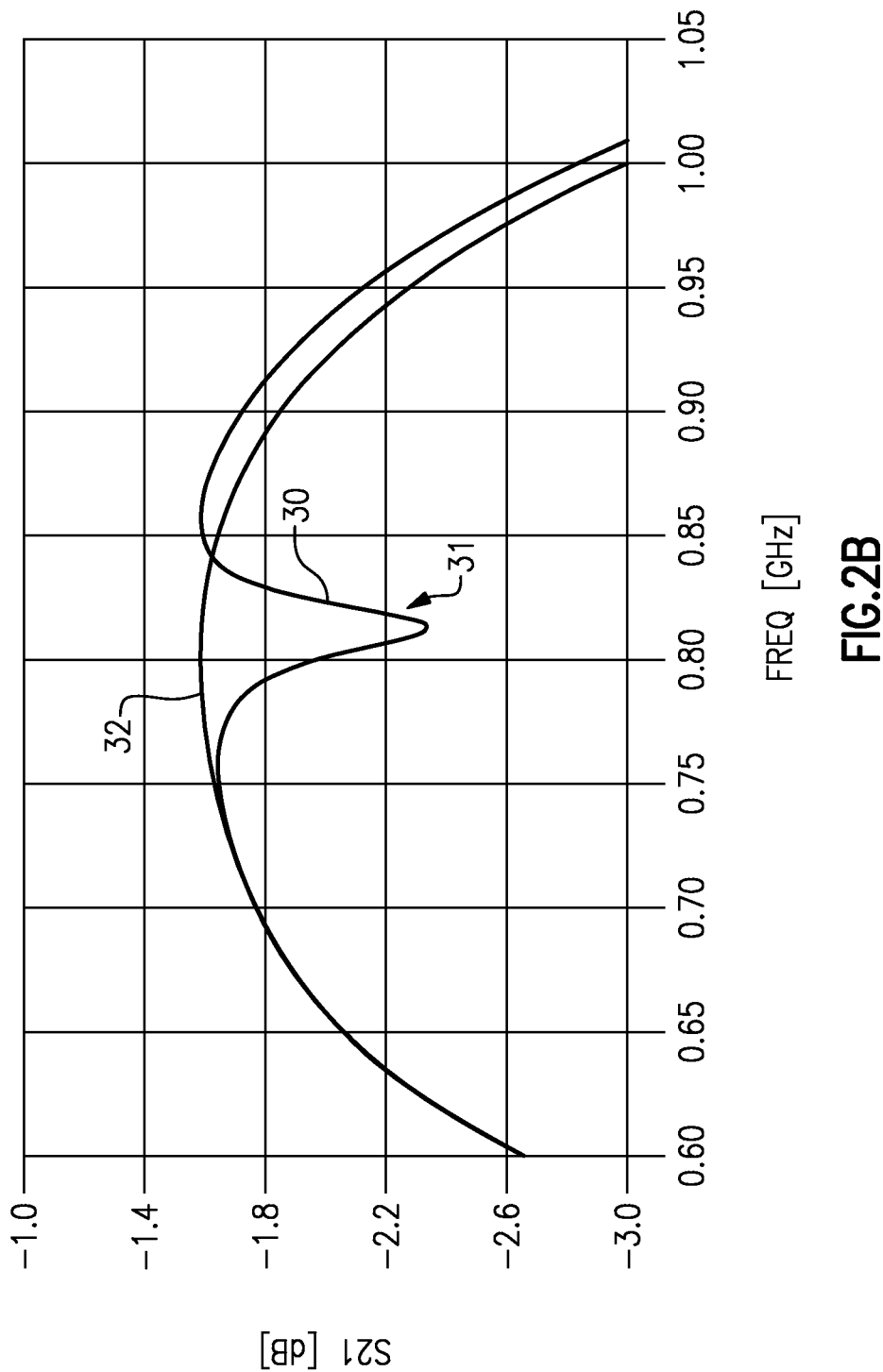
FIG. 2B is a graph illustrating insertion loss curves for an active pass band of FIG. 2A with band loading and the same active pass band without band loading.

FIG. 2B is a graph illustrating insertion loss curves for an active pass band with band loading and the same active pass band without band loading. In FIG. 2B, a first curve 30 represents insertion loss of the transmission path 23 for the active band illustrated in FIG. 2A. A notch 31 is present in the first curve 30 as a result of band loading. The notch 31 can occur due to the standing wave resonance of a non-active band, for example, as illustrated in FIG. 2A. The standing wave resonance can lead to suck out in the active band. In FIG. 2B, a second curve 32 represents the active pass band without band loading. The second curve 32 has desirable insertion loss characteristics relative to the first curve 30.

Surface current plots indicate that with a standing wave resonance as illustrated in FIG. 2A, the non-active path can sustain a significant current that consumes energy and is represented in the active band as a suck out, as indicated by the notch 31 of the first curve 30 of FIG. 2A. Other surface current plots indicate that with a matched load, such as a 50 Ohm load, at an input side of the band select switch 26 of the transmission path 22 of the non-active band, the non-active path shows minimal current which should not cause a significant suck out in the transmission path 23 for the active band.

Figure 3A:
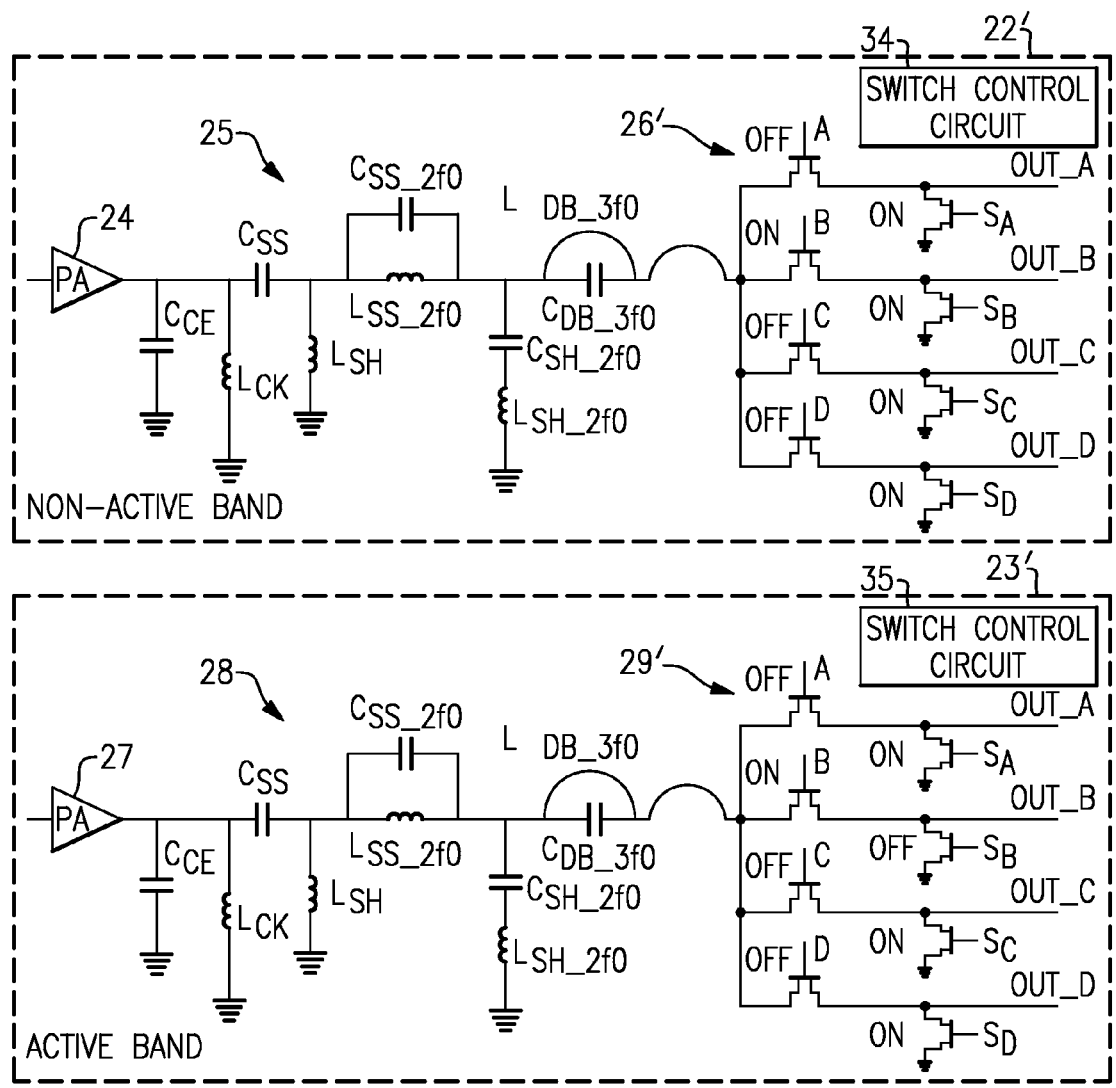
FIG. 3A is a schematic diagram of an active band and a non-active band with a band select switch configured to reduce band loading according to an embodiment.
Figure 4A:
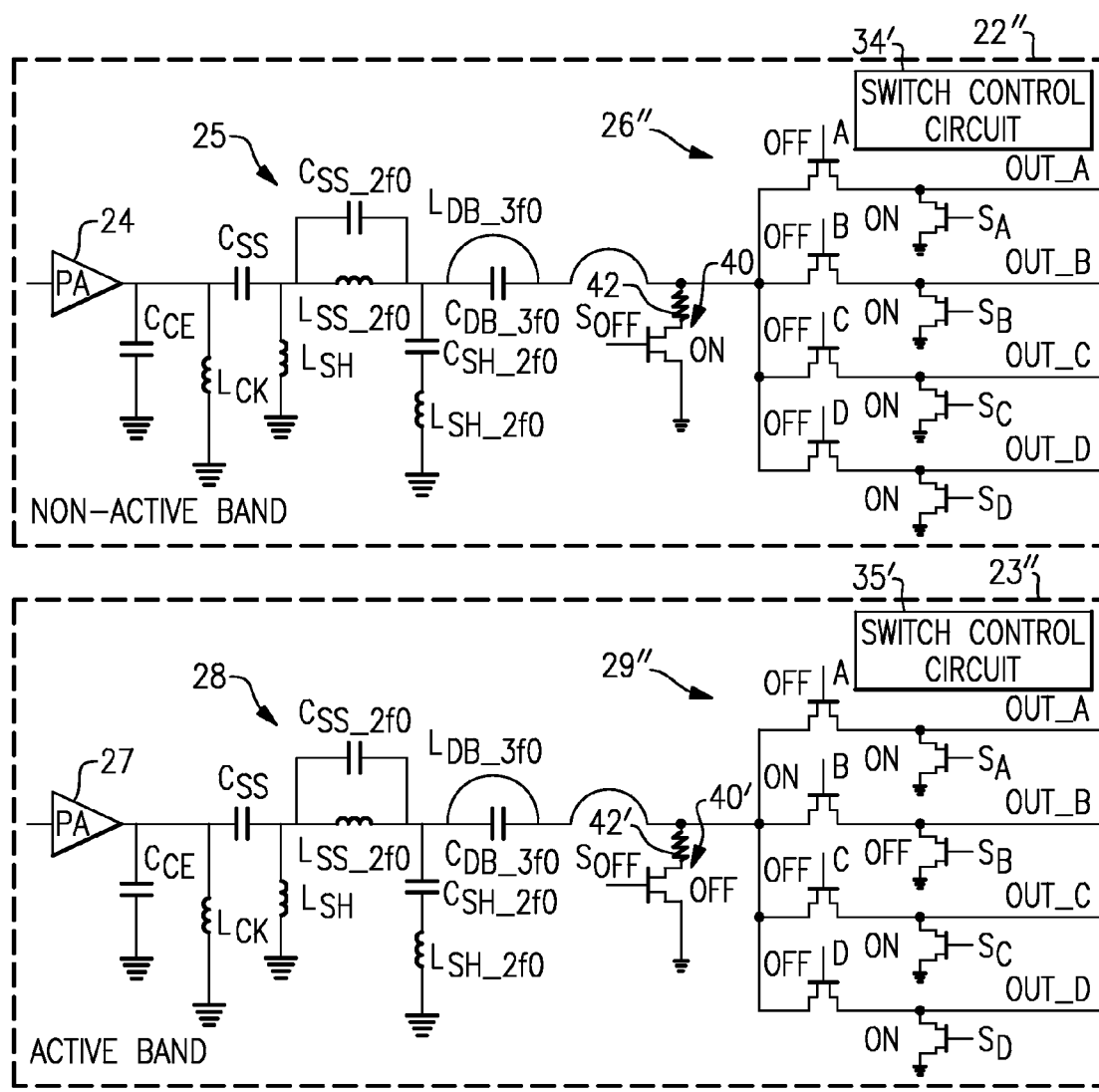
FIG. 4A is a schematic diagram of an active band and a non-active band with a shunt switch at an input of a band select switch according to an embodiment.
Figure 5A:
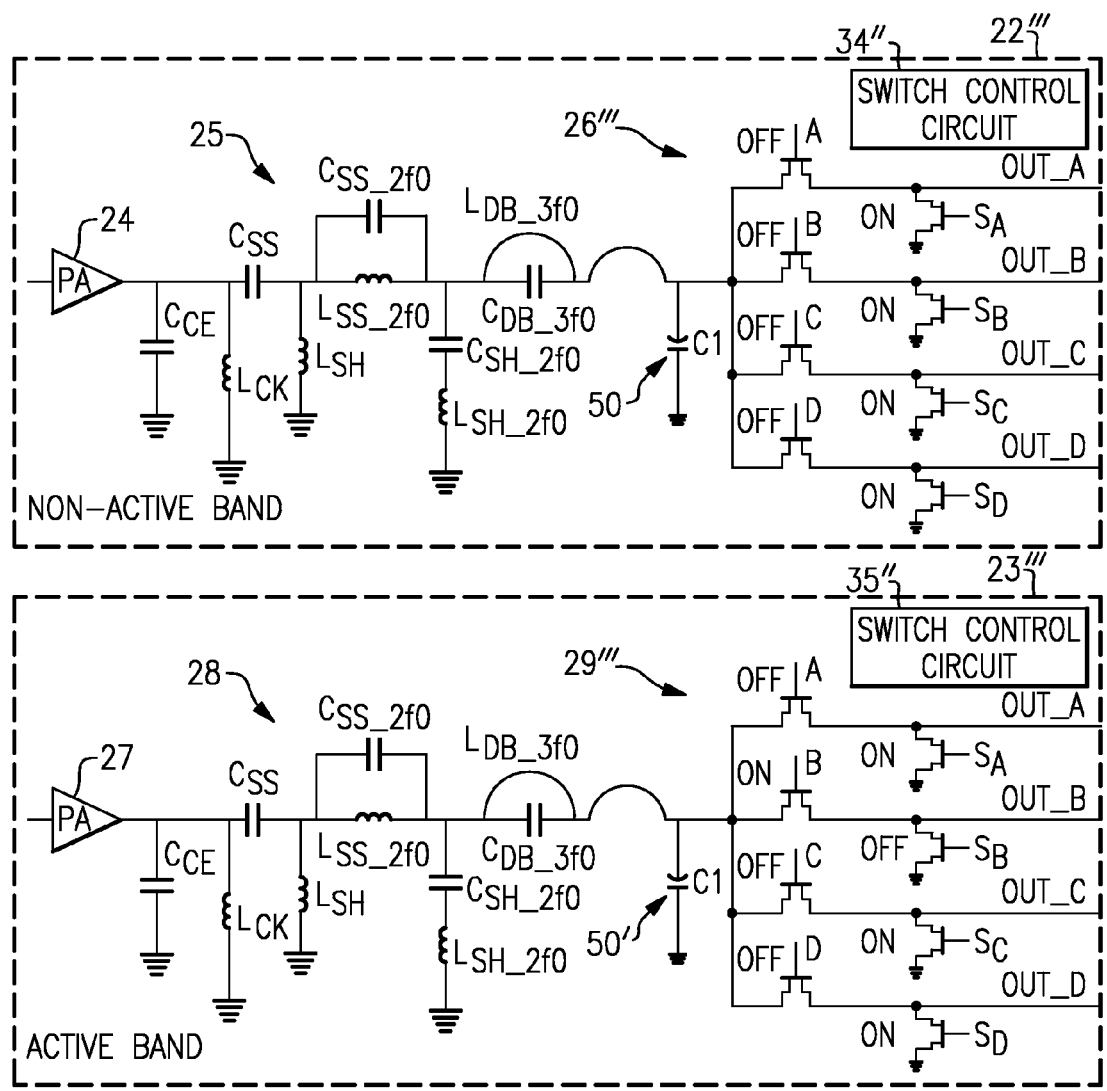
FIG. 5A is a schematic diagram of an active band and a non-active band with a shunt capacitor at an input of a band select switch according to an embodiment.

The band loading problem illustrated in FIG. 2A can be prevented by modifying the non-active band load impedance. For instance, the non-active band load impedance can be implemented by a non-active switch logic state in which the switch has at least one arm that is on as illustrated in FIG. 3A. As another example, the non-active band load impedance can be a finite switch input impedance in series with a passive impedance element in a non-active state as illustrated in FIG. 4A and FIG. 6A. As another example, the non-active band load can be implemented by a shunt reactance to avoid a completely open load as illustrated in FIG. 5A. As such, the non-active load impedance can include a relatively small shunt reactance, a selected non-active state switch input impedance that can be in series with a passive impedance circuit, a dedicated switch non-active state, or any combination thereof.

Figure 2C:
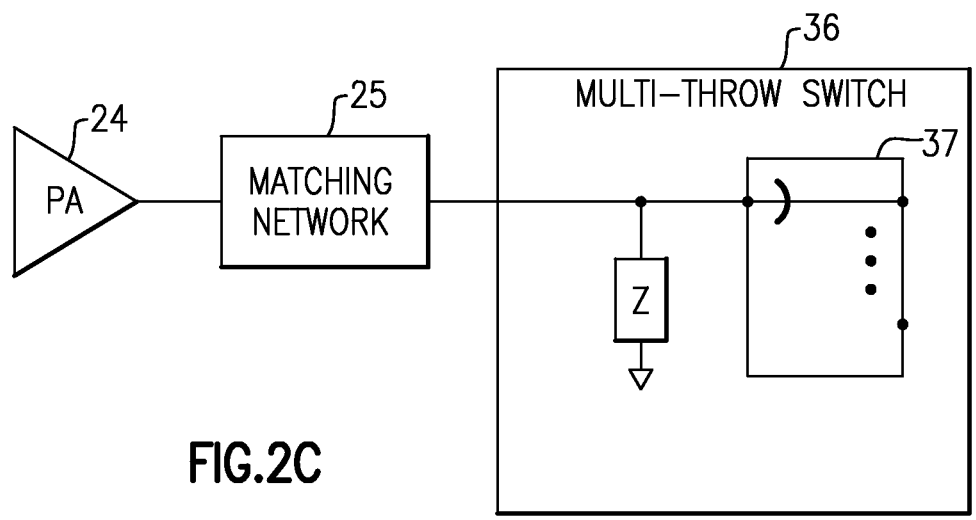
FIG. 2C is a schematic diagram of a radio frequency (RF) signal path that can reduce band loading according to an embodiment.

FIG. 2C is a schematic diagram of an RF signal path that can reduce band loading according to an embodiment. As illustrated, the RF signal path can include a power amplifier 24, a matching network 25, and a multi-throw switch 36. The illustrated multi-throw switch 36 includes a switch element 37 that can implement multiple throws with a switch arm and a shunt arm for each throw. The switch element 37 can implement any suitable number of throws. The RF signal path can provide an RF signal when active. The RF signal path can be located in relatively close physical proximity to one or more other RF signal paths.

A load impedance of the matching network 25 can prevent a resonance on the RF signal path due to coupling with another RF signal path in relatively close physical proximity when the other signal path is active. An input impedance Z of the multi-throw switch 36 can be included in such a load impedance on the matching network 25. In the absence of the input impedance Z of the multi-throw switch 36, a standing wave resonance can develop on the RF signal path due to coupling with the other RF signal path. The input impedance Z can be implemented by setting a state of the switch element 37, for example, in accordance with the principles and advantages that will be discussed with reference to FIG. 3A. In some other implementations, the input impedance Z can be implemented by a shunt capacitor. According to certain implementations, the input impedance Z can be implemented by an input shunt arm and a passive impedance circuit.

Figure 2D:
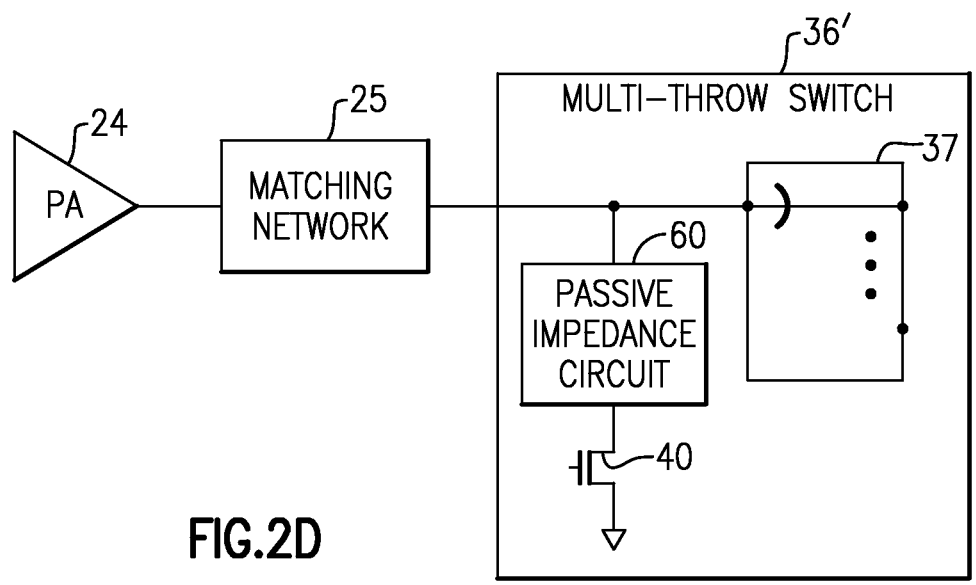
FIG. 2D is a schematic diagram of another RF signal path that can reduce band loading according to an embodiment.

FIG. 2D is a schematic diagram of an RF signal path that can reduce band loading according to an embodiment. The RF signal path of FIG. 2D is an example of the RF signal path of FIG. 2C in which the multi-throw switch 36' includes a shunt arm 40 in series with a passive impedance circuit 60 to implement an input impedance of the multi-throw switch. The shunt arm 40 can be on when the RF signal path is inactive. Accordingly, when the RF signal path is inactive, the passive impedance circuit 60 can be electrically connected to ground by way of the input shunt arm 40. The input shunt arm 40 can be off when the RF signal path is active. The passive impedance circuit 60 can be a resistor, any other suitable passive impedance element, or any other suitable combination of passive impedance elements.

Embodiments of a transmission path for a non-active band are illustrated in FIGS. 3A, 4A, 5A, and 6A. In these embodiments, the transmission path 22 of FIG. 2A is modified. It will be understood that one or more other transmission paths can also implement the principles and advantages discussed with reference to any of FIGS. 3A, 4A, 5A, and/or 6A. For instance, the one or more other transmission paths can include a transmission path for an active band. In some instances, the one or more other transmission paths can include a transmission path for another non-active band that is also non-active when the illustrated non-active band is non-active. Moreover, any combination of features of the embodiments of FIGS. 3A, 4A, 5A, and 6A can be combined with each other. During operation, different transmission paths can selectively be activated and deactivated. Each transmission path can be in an active state or non-active state. Accordingly, a transmission path that is described herein as being non-active can be active at another point in time. Similarly, a transmission path that is described herein as being active can be a non-active at another point in time.

While certain embodiments are described with reference to one active band and one active band, the principles and advantages discussed herein can be applied to carrier aggregation applications in which two or more bands can be active concurrently. For instance, the principles and advantages discussed herein can be applied when two active band paths cause band loading on a non-active band path. As another example, the principles and advantages discussed herein can be applied to preventing band loading between two active bands that can cause additional insertion loss from one active band to another active band. To reduce and/or eliminate band loading from one active band to another active band, any suitable principles and advantages discussed herein can be applied to preventing a resonance on an active band due to coupling with another active band. For instance, a shunt capacitor and/or input shunt arm at an output of a matching network and/or at an input of a band select switch can prevent such a resonance on an active path.

FIG. 3A is a schematic diagram of an active band and a non-active band with a band select switch configured to reduce band loading according to an embodiment. The transmission path 22' of FIG. 3A is a modified version of the transmission path 22 of FIG. 2A. The transmission path 22' includes the power amplifier 24, the matching network 25, and a band select switch 26'. The transmission path 23' of FIG. 3A is a modified version of the transmission path 23 of FIG. 2A. The transmission path 23' includes the power amplifier 27, the matching network 28, and a band select switch 29'. The transmission paths 22' and 23' can be in relatively close physical proximity to each other such that coupling can occur between the transmission paths. Embodiments of any of the transmission paths discussed herein can include more elements that illustrated and/or a subset of the illustrated elements. Moreover, a transmission path can include any suitable combination of features of any of the transmission paths disclosed herein.

The power amplifier 24 is configured to amplify an RF signal and provide an amplified RF signal. The power amplifier 24 can be any suitable RF power amplifier. For instance, the power amplifier 24 can be one or more of a single stage power amplifier, a multi-stage power amplifier, a power amplifier implemented by one or more bipolar transistors, or a power amplifier implemented by one or more field effect transistors. The power amplifier 24 can be deactivated when the transmission path 22' is non-active. For instance, a bias provided to the power amplifier 24 can deactivate the power amplifier 24 when the transmission path 22' is non-active.

The matching network 25 can aid in reducing signal reflections and/or other signal distortions. The matching network 25 can include one or more capacitors and one or more inductors. The matching network 25 can include more of a shunt capacitor, a shunt inductor, a shunt series LC circuit, a parallel LC circuit in a signal path between the power amplifier 24 and the band select switch 26', a capacitor in the signal path, or an inductor in the signal path. As illustrated by the arcs of the matching network 25, one or more inductors of the matching network 25 can be implemented by a bond wire. While the matching network 25 is provided for illustrative purposes, it will be understood that the principles and advantages discussed herein can be implemented in connection with any other suitable matching network.

The band select switch 26' is coupled to the power amplifier 24 by way of the matching network 25. The output of the matching network 25 can be provided to an input of the band select switch 26'. In an active state, the band select switch 26' can electrically couple an RF signal received at the input to a selected output. Different outputs of the band select switch 26' can be associated with a different defined frequency bands. For instance, two different outputs of the band select switch 26' can be associated with two different defined sub-bands of a defined frequency band of the transmission path 22'. The different outputs of the band select switch 26' can be electrically coupled to different transmissions paths that are associated with the different defined sub-bands. The different transmission paths can each include a filter and/or other circuitry for processing the RF signal for transmission within a respective defined sub-band.

The band select switch 26' and any of the other illustrated band select switches disclosed herein can be implemented in semiconductor-on-insulator technology, such as silicon-on-insulator technology. The illustrated band select switch 26' is a multi-throw switch. While the band select switch 26' is shown as a single pole multi-throw switch for illustrative purposes, it will be understood that the principles and advantages discussed herein can be applied to RF signal paths that include multi-pole multi-throw switches.

Each throw of the band select switch 26' includes a switch arm and a shunt arm electrically coupled to the switch arm. The switch arm can provide an input signal received from the matching network 25 to an output of the band select switch 26' when the switch arm is on. The switch arm can be implemented by a field effect transistor as illustrated. The switch arm can turned on and turned off based on a control signal for the switch arm, such as one of the control signals A, B, C, or D illustrated in FIG. 3A. As illustrated in FIG. 3A, the control signal can be provided to a gate of the field effect transistor that implements the switch arm. The shunt arm can provide a path to ground when the shunt arm is on. The shunt arm can be implemented by a field effect transistor as illustrated. The shunt arm can turned on and turned off based on a shunt control signal for the shunt arm, such as one of the shunt control signals $S_A$, $S_B$, $S_C$, or $S_D$ illustrated in FIG. 3A. As illustrated in FIG. 3A, the shunt control signal can be provided to a gate of the field effect transistor that implements the shunt arm. The shunt arm can provide suitable band to band isolation in the band select switch 26', particularly when the band select switch 26' is implemented in silicon-on-insulator technology.

The band select switch 26' can electrically couple its input to a selected output by turning a switch arm associated with the selected output on and turning a shunt arm associated with the selected output off. The other switch arms of the band select switch 26' can be off and the other respective shunt arms of the band select switch 26' can be on while the input is being electrically coupled to the selected output. This can electrically isolate the input of the band select switch 26' from the non-selected outputs.

The band select switch 29' can implement any of features discussed with reference to the band select switch 26'. While the band select switch 29' is shown in the active state, in a non-active state the band select switch 29' can operate in a state similar to the illustrated state of the band select switch 26'. The switch control circuit 35 can operate similarly to the switch control circuit 34 of the transmission path 22'.

While the band select switches illustrated in FIGS. 2A, 3A, 4A, 5A, and 6A include a series field effect transistor and a shunt field effect transistor for each throw, it will be understood that in some other embodiments a band select switch can include a series field effect transistor without a shunt field effect transistor for some or all of the throws.

The power amplifier 24 of transmission path 22' can be electrically decoupled from an antenna, such as the antenna 18 of FIG. 1, by setting the band select switch 26' to a non-active state. The non-active state can also be referred to as an off state. In the non-active state of the band select switch 26', the band select switch 26' electrically isolates the output of the matching network 25 from all of the outputs of the band select switch 26'.

In the embodiment shown in FIG. 3A, one of the switch arms is on and the remaining switch arms are off in the non-active state of the band select switch 26'. The shunt arm associated with the switch arm that is on is also on in the non-active state. Having one switch arm on and the associated shunt arm on can provide an impedance at the load side of the matching network 25 to reduce the reflection from the load and thereby damp any standing wave amplitude in the non-active transmission path 22'. Accordingly, band loading on the transmission path 23' when it is active can be reduced and/or eliminated. In some other embodiments (not shown in FIG. 3A), two or more switch arms and their corresponding shunt arms can be on to thereby provide an impedance at the load side of the matching network 25 to prevent resonance due to coupling with an active band.

A switch control circuit 34 can provide control signals A, B, C, D, $S_A$, $S_B$, $S_C$, and $S_D$ to the band select switch 26'. The switch control circuit 34 can control the state of the band select switch 26' by providing the control signals. The control signals can set the state of the band select switch 26' to the non-active state when the transmission path 22' is non-active. The control signals can set the state of the band select switch 26' to an active state in which the input of the band select switch 26' is provided to a selected output of the band select switch 26' when the transmission path 22 is active. The switch control circuit 34 can be implemented by any suitable circuitry.

Figure 3B:
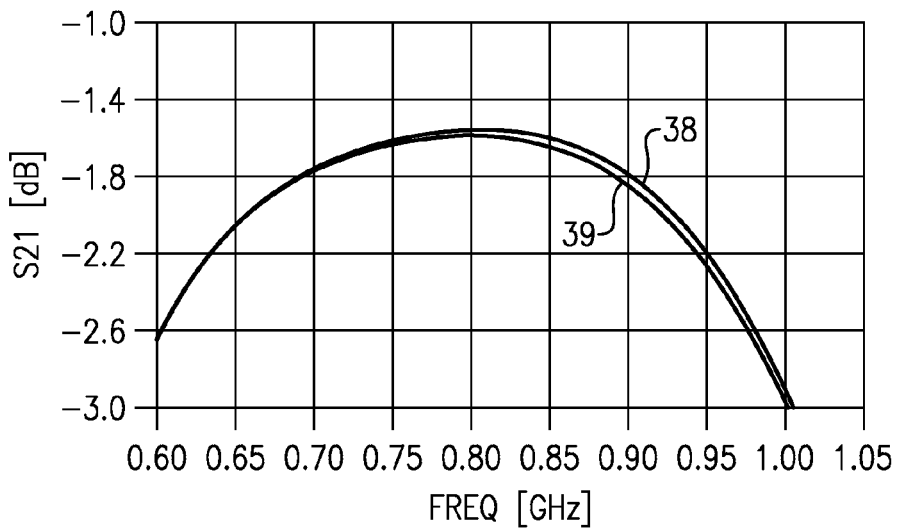
FIG. 3B is a graph illustrating insertion loss curves for an active pass band in accordance with the embodiment of FIG. 3A and an active pass band without band loading.

FIG. 3B is a graph illustrating insertion loss curves for an active pass band with in accordance with the embodiment of FIG. 3A and an active pass band without band loading. The curve 38 is associated with the embodiment of FIG. 3A and the curve 39 is associated with no banding loading on the active band. As shown by the curves 38 and 39 of FIG. 3B, the embodiment of FIG. 3A works well to prevent band loading.

FIG. 4A is a schematic diagram of an active band and a non-active band with a shunt switch arm at an input of a band select switch according to an embodiment. The transmission path 22" illustrated in FIG. 4A includes a power amplifier 24 and a matching network 25 that can implement any combination of features discussed with reference to FIG. 3A. The transmission path 22" of FIG. 4A includes a different band select switch than the transmission path 22' of FIG. 3A. In addition, relative to the switch control circuit 34 of FIG. 3A, the switch control circuit 34' of FIG. 4A can provide an additional control signal and/or can provide different values of some signals provided to the band select switch 26" when the band select switch 26" is in a non-active state.

The transmission path 23" can implement any combination of features of the transmission path 22". The transmission path 23" can be in an active state while the transmission path 22" is in a non-active state. The transmission paths 22" and 23" can be in relatively close physical proximity to each other such that coupling can occur between the transmission paths.

The band select switch 26" of FIG. 4A includes an input shunt arm 40 at the input of the band select switch 26". The input shunt arm 40 can be on when the transmission path 22" is non-active and off when the transmission path 23" is active. When the input shunt arm 40 is on, it can provide a shunt path. The input shunt arm 40 and a resistor 42 can be in series between the input of the band select switch 26" and ground. When the input shunt arm 40 is on, the input shunt arm 40 and the resistor 42 can together provide a desired matching impedance, such as approximately 50 Ohms. As one example, the resistor 42 can have a resistance of about 44 Ohms such that the series resistance of the resistor 42 and the shunt arm 40 is about 50 Ohms when the shunt arm 40 is on.

The input shunt arm 40 can be implemented by a field effect transistor as illustrated in FIG. 4A. The field effect transistor can be an N-type transistor as illustrated. The source of the field effect transistor can be connected to ground, the drain of the field effect transistor can be connected to the input of the band select switch 26", and the gate of the field effect transistor can receive an off state control signal $S_{OFF}$. The switch control circuit 34' of FIG. 4A can control the off state control signal $S_{OFF}$ such that the input shunt arm 40 is on when the transmission path 22" is non-active and the input shunt arm 40 is off when the transmission path 22" is active. Alternatively, the switch control circuit 34' of FIG. 4A can control the input shunt arm 40 of the transmission path 22" such that the input shunt arm 40 is on when the transmission path 23" is active and the input shunt arm is off when the transmission path 23" is non-active.

The input shunt arm 40 of the band select switch 26" can provide an impedance at the load side of the matching network 25 to reduce the reflection from the load and thereby damp any standing wave amplitude in the non-active transmission path 22". Accordingly, band loading on the active transmission path 23" can be reduced and/or eliminated.

The band select switch 29" includes an input shunt arm 40' in series with a resistor 42'. While the band select switch 29" is shown in an active state, in a non-active state the band select switch 29" can operate in a state similar to the illustrated state of the band select switch 26". Accordingly, the band select switch 29" can implement any of features discussed with reference to the band select switch 26" prevent an unwanted resonance on the transmission path 23". This can cause band loading on the transmission path 22" in an active state (not illustrated) to be reduced and/or eliminated.

Figure 4B:
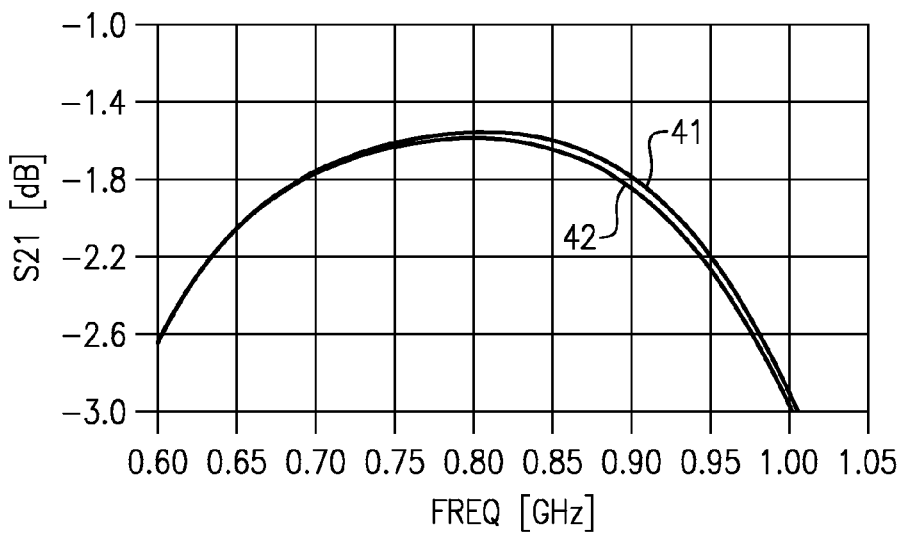
FIG. 4B is a graph illustrating insertion loss curves for an active pass band in accordance with the embodiment of FIG. 4A and an active pass band without band loading.

FIG. 4B is a graph illustrating insertion loss curves for an active pass band with in accordance with the embodiment of FIG. 4A and an active pass band without band loading. The curve 41 is associated with the embodiment of FIG. 4A and the curve 42 is associated with no banding loading on the active band. As shown by the curves 41 and 42 of FIG. 4B, the embodiment of FIG. 4A works well to prevent band loading.

FIG. 5A is a schematic diagram of an active band and a non-active band with a shunt capacitor at an input of a band select switch according to an embodiment. The transmission path 22''' illustrated in FIG. 5A includes a power amplifier 24 and a matching network 25 that can implement any combination of features discussed with reference to FIGS. 3A and/or 4A. The transmission path 22''' of FIG. 5A includes a different band select switch than the transmission path 22' of FIG. 3A and the transmission path 22" of FIG. 4A.

The transmission path 23''' can implement any combination of features of the transmission path 22'. The transmission path 23''' can be in an active state while the transmission path 22''' is in a non-active state. The transmission paths 22' and 23' can be in relatively close physical proximity to each other such that coupling can occur between the transmission paths.

The band select switch 26' of FIG. 5A includes an shunt capacitor 50 at the input of the band select switch 26'. The shunt capacitor 50 can be considered part of the band select switch 26''' even if it is implemented separately. The shunt capacitor 50 can have a relatively small capacitance, such as a capacitance on the order of a few picofarads (pF). The capacitance of the shunt capacitor 50 can be selected such that an impedance of the shunt capacitor 50 matches a selected impedance at a frequency of the active band. In an illustrative example, the shunt capacitor can have a capacitance in a range from about 2 pF to 3 pF to match a 50 Ohm impedance in certain applications. The shunt capacitor 50 can prevent a standing wave resonance on the non-active path 22'''.

As illustrated, the band select switch 29''' of the transmission path 23''' includes a shunt capacitor 50' that can provide the same or similar functionality to the shunt capacitor 50. The shunt capacitors 50 and 50' can have approximately the same capacitances in certain applications. In other applications, the shunt capacitors 50 and 50' can have different capacitances.

The switch control circuits 34" and 35" can provide the same or similar functionality as the other switch control circuits 34 and 35, respectively.

Figure 5B:
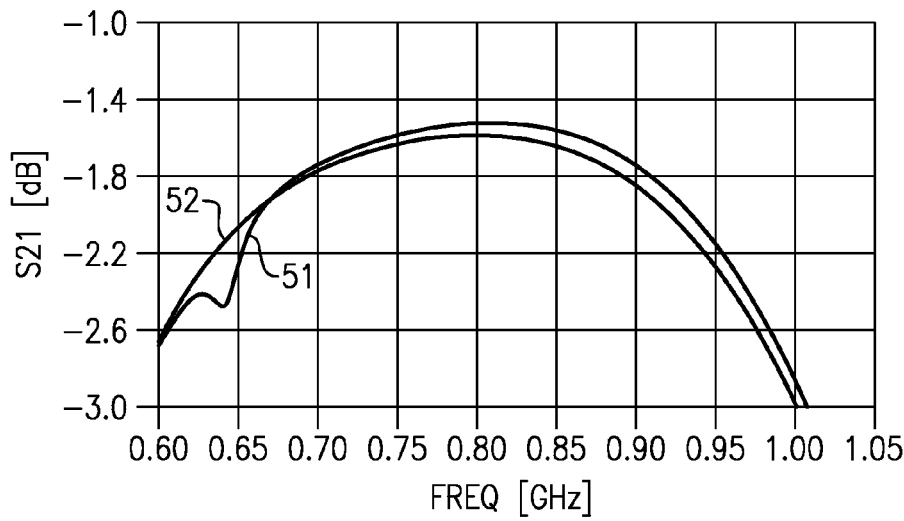
FIG. 5B is a graph illustrating insertion loss curves for an active pass band in accordance with the embodiment of FIG. 5A and an active pass band without band loading.

FIG. 5B is a graph illustrating insertion loss curves for an active pass band with in accordance with the embodiment of FIG. 5A and an active pass band without band loading. The curve 51 is associated with the embodiment of FIG. 5A and the curve 52 is associated with no banding loading on the active band. As shown by the curves 51 and 52 of FIG. 5B, the embodiment of FIG. 5A works well to prevent band loading. The curve 51 of FIG. 5B has a notch in the insertion loss curve between about 0.60 GHz and 0.65 GHz. This notch can be created by a shunt capacitor being present in the signal path in the active band.

FIG. 6A is a schematic diagram of an active band and a non-active band with a shunt switch arm at an input of a band select switch according to an embodiment. The transmission path 22'''' illustrated in FIG. 6A is similar to the transmission path 22" of FIG. 4A except that a passive impedance circuit 60 is shown in place of a resistor 42. Accordingly, any suitable passive impedance circuit can be implemented in series with an input shunt arm 40 of a band select switch to provide an impedance to prevent (e.g., reduce or eliminate) a standing wave resonance on a non-active band due to coupling with an active band.

Figure 6B:
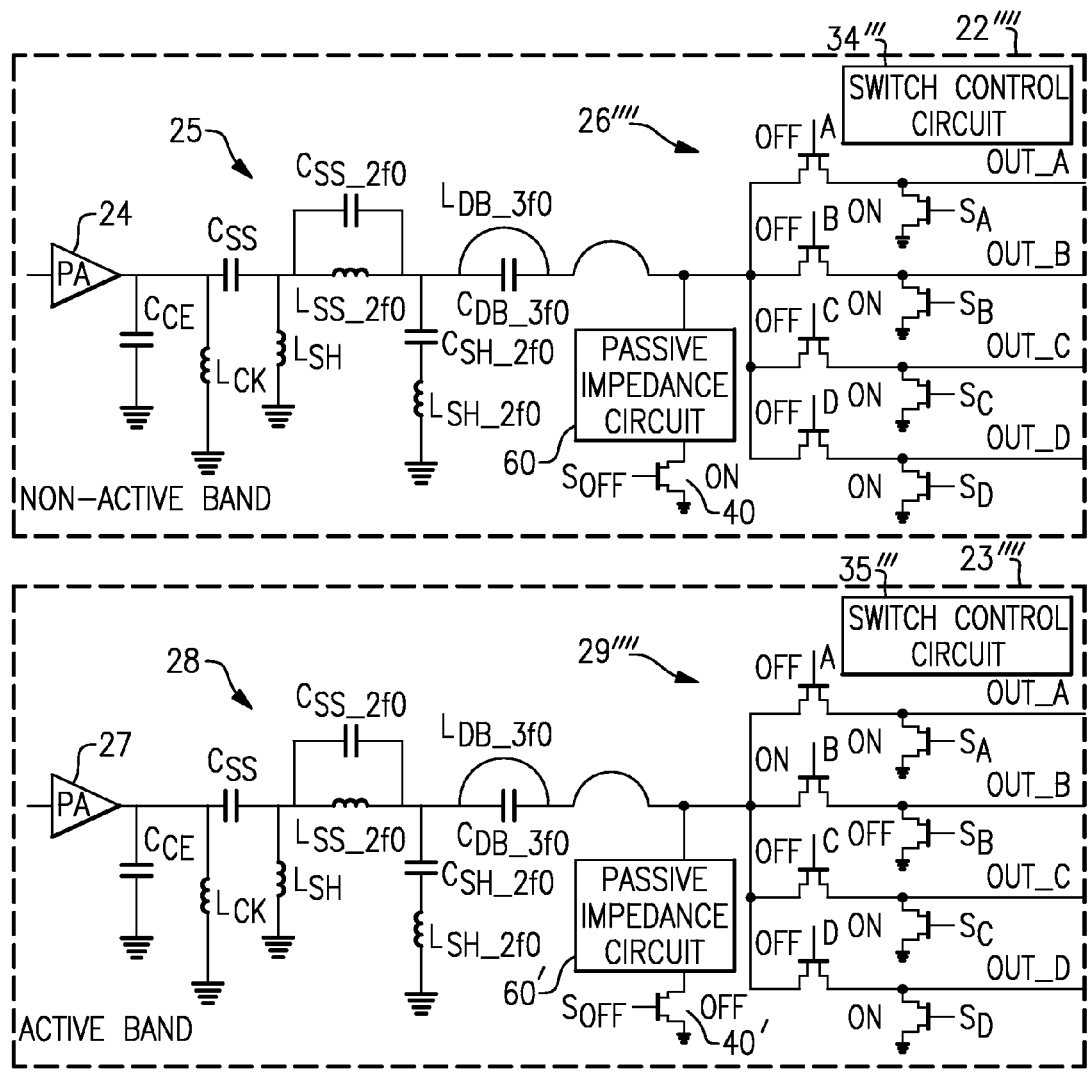
FIGS. 6B to 6G illustrate example passive impedance circuits of FIG. 6A.
Figure 6B:
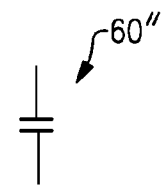
Figure 6C:
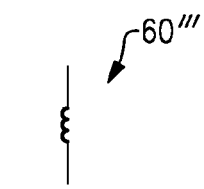
Figure 6D:
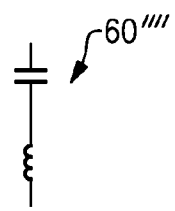
Figure 6E:
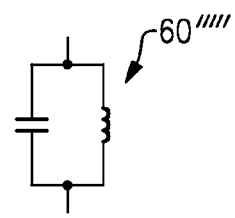
Figure 6F:
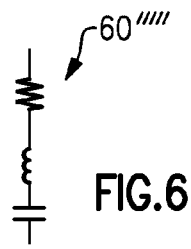
Figure 6G:
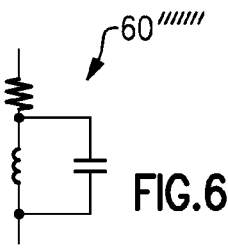

The passive impedance circuit 60 can be implemented by any suitable passive impedance element(s). The resistor 42 of FIG. 4A is one example of a suitable passive impedance circuit 60. FIGS. 6B to 6G illustrate other examples of the passive impedance circuit 60 of FIG. 6A. As shown in FIG. 6B, a capacitor can implement a passive impedance circuit 60". As another example, an inductor can implement a passive impedance circuit 60''' as shown in FIG. 6C. Suitable passive impedance circuits can include series and/or parallel combinations of passive impedance elements, for example, as illustrated in FIGS. 6D to 6G. A series LC circuit can implement a passive impedance circuit 60'''' as shown in FIG. 6D. A parallel LC circuit can implement a passive impedance circuit 60''''' as shown in FIG. 6E. FIG. 6F shows a series RLC passive impedance circuit 60". As one more example, a resistor in series with a parallel LC circuit can implement a passive impedance circuit 60'''''' as shown in FIG. 6G.

Referring back to FIG. 6A, the transmission path 23'''' can implement any combination of features of the transmission path 22''''. The transmission path 23'''' can be in an active state while the transmission path 22'''' is in a non-active state. The transmission paths 22' and 23'''' can be in relatively close physical proximity to each other such that coupling can occur between the transmission paths.

The band select switch 26' of FIG. 6A is similar to the band select switch 26" of FIG. 4A except that the passive impedance circuit 60 is shown in place of the resistor 42. The band select switch 29" of FIG. 6A is similar to the band select switch 29" of FIG. 4A except that the passive impedance circuit 60' is shown in place of the resistor 42'. The passive impedance circuit 60' of the transmission path 23" can provide the same or similar functionality to the passive impedance circuit 60. The passive impedance circuits 60 and 60' can have the same circuit topology in certain applications. In other applications, the passive impedance circuits 60 and 60' can have different circuit topologies.

The switch control circuits 34''' and 35''' can provide the same or similar functionality as the other switch control circuits 34' and 35', respectively.

While FIGS. 3A, 4A, 5A, and 6A illustrate examples of loads at an input of a band select switch that can reduce an LC resonance and/or a standing wave resonance of an output matching network of a non-active transmission path, it will be understood that other suitable loads can be provided to prevent standing wave resonances from a matching network that includes capacitors and inductors.

Figure 7:
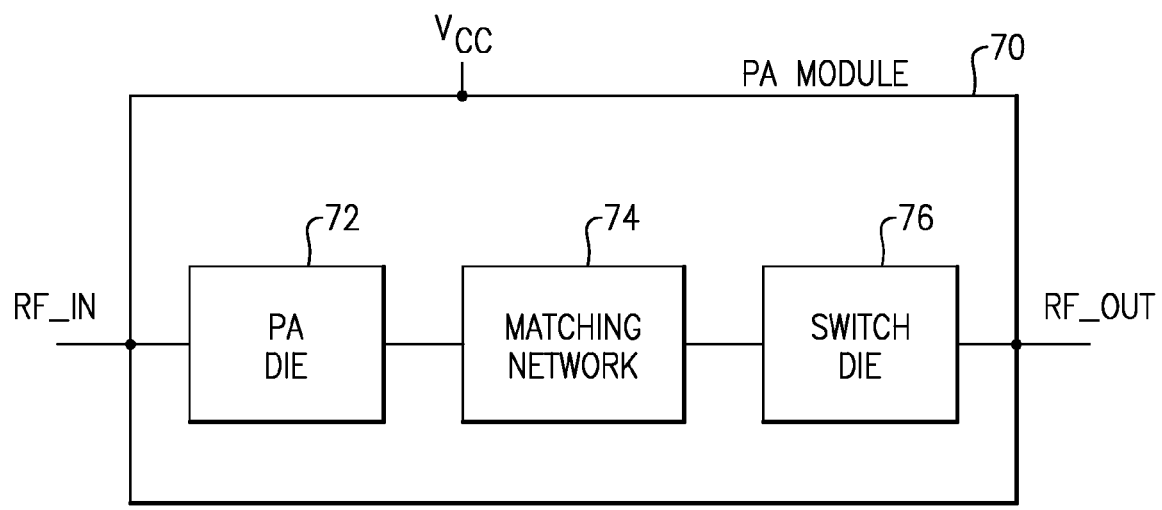
FIG. 7 is a schematic block diagram of an example power amplifier module that that include transmission paths in accordance with any of the embodiments of FIGS. 3A, 4A, 5A, and/or 6A.

FIG. 7 is a schematic block diagram of an example power amplifier module 70 that that include transmission paths in accordance with any of the embodiments discussed herein, such as any of the embodiments discussed with reference to FIGS. 3A, 4A, 5A, and/or 6A. The illustrated power amplifier module 70 includes a power amplifier die 72, a matching network 74, and a switch die 76. The power amplifier module 70 can be a packaged module that includes a package encapsulating the power amplifier die 72, the matching network 74, and the switch die 76. The power amplifier die 72, the matching network 74, and the switch die 76 can be mounted to and/or implemented on a common substrate. The common substrate can be a laminate substrate or other suitable packaging substrate. In some other embodiments (not shown in FIG. 7), the power amplifier and the band select switch can be implemented on a single die.

The power amplifier die 72 can include any of the power amplifiers discussed herein, such as the power amplifiers 24 and/or 27. The power amplifier die 72 can be a gallium arsenide (GaAs) die, CMOS die, or a silicon germanium (SiGe) die in certain implementations. The power amplifier die 72 can include one or more bipolar power amplifier transistors, such as heterojunction bipolar transistors, and/or one or more field effect bipolar transistors.

The matching network 74 can include some or all of the circuit elements of the matching networks discussed herein, such as the matching networks 25 and/or 28. The matching network 74 can include one or more surface mounted capacitors, one or more surface mounted inductors, one or more inductors implemented by a spiral trace on and/or in a packaging substrate, one or more capacitors implemented on a separate die or a printed circuit board, one or more inductors implemented on a separate die or a printed circuit board, one or more bond wires the like, or any combination thereof. As one example, the matching network 74 can include an integrated passive device (IPD) die, surface mounted capacitors, spiral inductors implemented on a substrate, and bond wires that implement inductors. In an embodiment (not shown in FIG. 7), a portion of the matching network, such as one or more capacitors, can be implemented on the power amplifier die 72.

The switch die 76 can include one or more of the band select switches discussed herein, such as the band select switches of FIGS. 3A, 4A, 5A, and/or 6A. The switch die 76 can include switch select logic, such as the switch select logic discussed with reference to FIGS. 3A and/or 4A. The switch die 76 can be a manufactured with a different process technology than the power amplifier die 72. In certain implementations, the switch die 76 can be a CMOS die or a semiconductor-on-insulator (SOI) die, such as a silicon-on-insulator die.

While FIG. 7 relates to a power amplifier module for illustrative purposes, transmission paths in accordance with any of the embodiments discussed herein can be implemented in various modules. For instance, any of the principles and advantages discussed herein can be implemented in a multi-chip module and/or a front end module. Such modules can include additional circuits and/or die(s) enclosed within the same package as the first transmission paths. The modules can be components for mobile devices such as smart phones.

Figure 8:
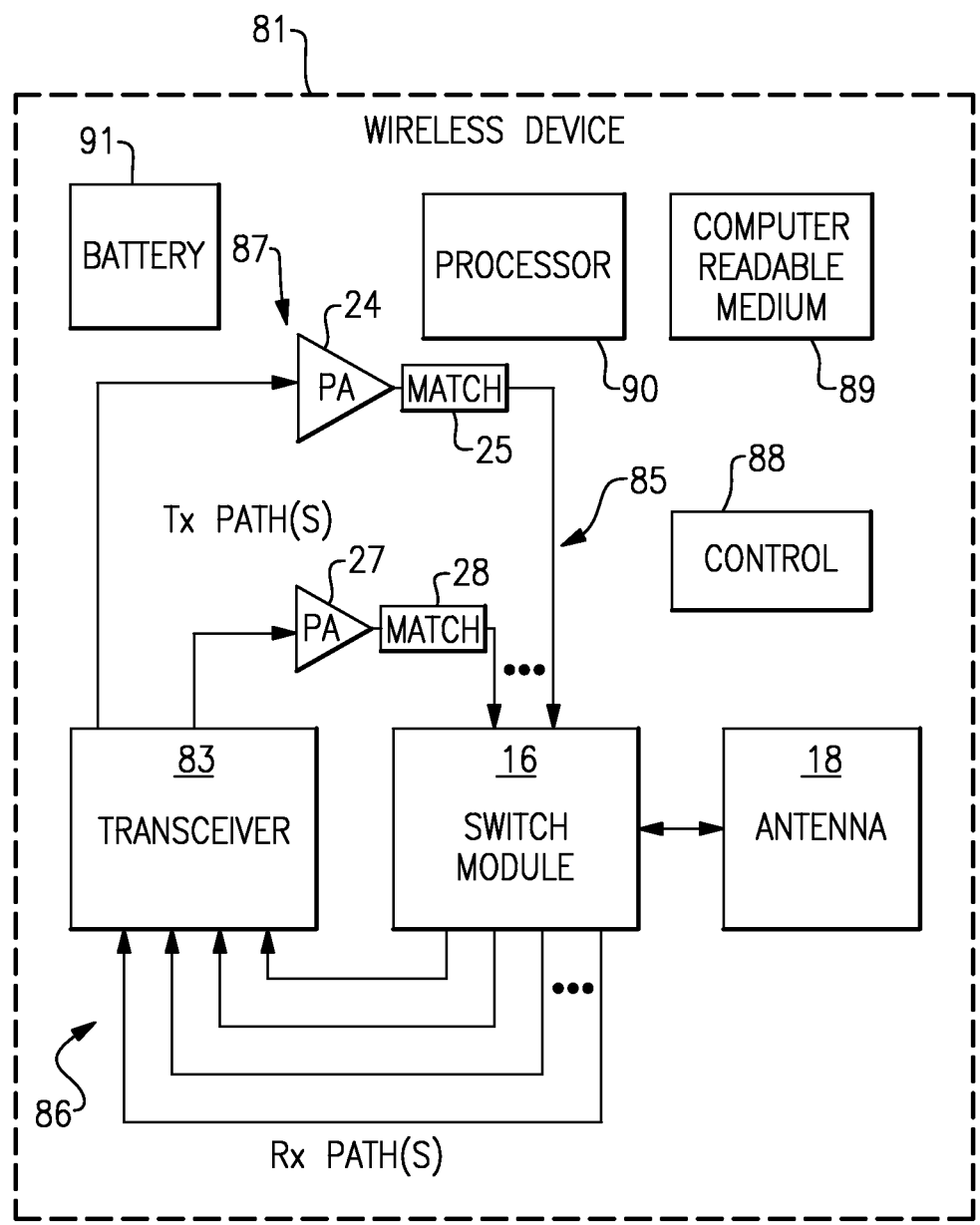
FIG. 8 is a schematic block diagram of an example mobile device that that include transmission paths in accordance with any of the embodiments of FIGS. 3A, 4A, 5A, and/or 6A.

FIG. 8 is a schematic block diagram of one example of a wireless or mobile device 81 that can include one or more power amplifiers and an antenna switch module. The wireless device 81 can have one or more transmit paths 85 that implement one or more features of the present disclosure. For instance, the transmit paths 85 of the wireless device 81 can include the transmission paths in accordance with any of the principles and advantages discussed with any of FIGS. 1, 3A, 4A, 5A, or FIG. 6A. As another example, any of the band select switches and/or select switches discussed herein can be included in the switch module 16 of FIG. 8. Similarly, the switch module 16 and the antenna 18 of FIG. 8 can correspond to the switch module 16 and the antenna 18, respectively, of FIG. 1. Additional elements, such as any of the matching networks discussed herein can be disposed between the output of any of the power amplifiers 87 and the switch module 16 of FIG. 8.

The example wireless device 81 depicted in FIG. 8 can represent a multi-band and/or multi-mode device such as a multi-band/multi-mode mobile phone. By way of example, the wireless device 81 can communicate in accordance with Long Term Evolution (LTE). In this example, the wireless device can be configured to operate at one or more frequency bands defined by an LTE standard. The wireless device 81 can alternatively or additionally be configured to communicate in accordance with one or more other communication standards, including but not limited to one or more of a Wi-Fi standard, a 3G standard, a 4G standard or an Advanced LTE standard. Transmit paths of the present disclosure can be implemented within a mobile device implementing any combination of the foregoing example communication standards, for example.

As illustrated, the wireless device 81 can include a switch module 16, a transceiver 83, an antenna 18, power amplifiers 87, matching networks 25 and 28, a control component 88, a computer readable storage medium 89, a processor 90, and a battery 91.

The transceiver 83 can generate RF signals for transmission via the antenna 18. Furthermore, the transceiver 83 can receive incoming RF signals from the antenna 18. It will be understood that various functionalities associated with transmitting and receiving of RF signals can be achieved by one or more components that are collectively represented in FIG. 8 as the transceiver 83. For example, a single component can be configured to provide both transmitting and receiving functionalities. In another example, transmitting and receiving functionalities can be provided by separate components.

In FIG. 8, one or more output signals from the transceiver 83 are depicted as being provided to the antenna 18 via one or more transmission paths 85. In the example shown, different transmission paths 85 can represent output paths associated with different bands (e.g., a high band and a low band) and/or different power outputs. For instance, the two different paths shown can represent two of the different transmission paths of any of the front end architectures discussed with reference to FIGS. 1, 3A, 4A, 5A, and/or 6A. The transmission paths 85 can be associated with different transmission modes. One of the illustrated transmission paths 85 can be active while one or more of the other transmission paths 85 are non-active, for example, as discussed above. Alternatively, two or more transmission paths 85 can be active in carrier aggregation applications. Other transmission paths 85 can be associated with different power modes (e.g., high power mode and low power mode) and/or paths associated with different transmit frequency bands. The transmit paths 85 can include one or more power amplifiers 87 to aid in boosting a RF signal having a relatively low power to a higher power suitable for transmission. As illustrated, the power amplifiers 87 can include the power amplifiers 24 and 27 discussed above. Although FIG. 8 illustrates a configuration using two transmission paths 85, the wireless device 81 can be adapted to include more than two transmission paths 85.

In FIG. 8, one or more detected signals from the antenna 18 are depicted as being provided to the transceiver 83 via one or more receive paths 86. In the example shown, different receive paths 86 can represent paths associated with different signaling modes and/or different receive frequency bands. Although FIG. 8 illustrates a configuration using four receive paths 86, the wireless device 81 can be adapted to include more or fewer receive paths 86.

To facilitate switching between receive and/or transmit paths, the antenna switch module 16 can be included and can be used to selectively electrically connect the antenna 18 to a selected transmit or receive path. Thus, the antenna switch module 16 can provide a number of switching functionalities associated with an operation of the wireless device 81. The antenna switch module 16 can include a multi-throw switch configured to provide functionalities associated with, for example, switching between different bands, switching between different modes, switching between transmission and receiving modes, or any combination thereof. The switch module 16 can include any of the band select switches discussed herein.

FIG. 8 illustrates that in certain embodiments, the control component 88 can be provided for controlling various control functionalities associated with operations of the antenna switch module 16 and/or other operating component(s). For example, the control component 88 can aid in providing control signals to the antenna switch module 16 so as to select a particular transmit or receive path.

In certain embodiments, the processor 90 can be configured to facilitate implementation of various processes on the wireless device 81. The processor 90 can be, for example, a general purpose processor or special purpose processor. In certain implementations, the wireless device 81 can include a non-transitory computer-readable medium 89, such as a memory, which can store computer program instructions that may be provided to and executed by the processor 90.

The battery 91 can be any battery suitable for use in the wireless device 81, including, for example, a lithium-ion battery.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. The teachings herein are applicable to a variety of power amplifier systems including systems with multiple power amplifiers, including, for example, multi-band and/or multi-mode power amplifier systems. The power amplifier transistors discussed herein can be, for example, gallium arsenide (GaAs), CMOS, or silicon germanium (SiGe) transistors. The power amplifiers discussed herein can be implemented by field effect transistors and/or bipolar transistors, such as heterojunction bipolar transistors.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand-held computer, a laptop computer, a tablet computer, a wearable computing device such as a smart watch, a personal digital assistant (PDA), a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency circuit comprising:
a first radio frequency signal path configured to provide a first radio frequency signal when active; and
a second radio frequency signal path configured to provide a second radio frequency signal when active, the second radio frequency signal path including a matching network with a load impedance configured to prevent a standing wave resonance from developing in the second radio frequency signal path due to coupling with the first radio frequency signal path when the first radio frequency signal path is active, the matching network being coupled between an amplifier and a switch.

2. The radio frequency circuit of claim 1 wherein the load impedance of the matching network is configured to prevent the resonance in the second radio frequency signal path due to coupling with the first radio frequency signal path when the second radio frequency signal path is non-active and the first radio frequency signal path is active.

3. The radio frequency circuit of claim 1 wherein the first radio frequency signal path includes a first power amplifier configured to provide the first radio frequency signal and the second radio frequency signal path includes a second power amplifier configured to provide the second radio frequency signal.

4. The radio frequency circuit of claim 1 wherein the select switch is configured to selectively provide the second radio frequency signal to an output on an antenna side of the select switch.

5. The radio frequency circuit of claim 4 wherein the select switch is a multi-throw switch including a plurality of throws on a non-antenna side of the select switch that are each configured to receive the second radio frequency signal.

6. The radio frequency circuit of claim 5 wherein each of the throws of the multi-throw switch includes a switch arm and a shunt arm electrically coupled to the respective switch arm, the select switch is configured to have a selected switch arm on and a selected shunt arm on when the radio frequency path second path is non-active and the first radio frequency signal path is active, and the selected switch arm and the selected shunt arm being on contribute to the load impedance.

7. The radio frequency circuit of claim 4 wherein the load impedance includes an input shunt arm and passive impedance element in series between an input of select switch and ground.

8. The radio frequency circuit of claim 7 wherein the passive impedance element is a resistor.

9. The radio frequency circuit of claim 4 wherein the load impedance includes a shunt capacitor having a first end and a second end, the first end electrically coupled to an input of the select switch, and the second end electrically coupled to a ground potential.

10. The radio frequency circuit of claim 1 wherein the first radio frequency signal and the second radio frequency signal are in different frequency bands.

11. An electronic system for transmission of radio frequency finals, the electronic system comprising:
    a first transmission path including a first power amplifier configured to provide a first radio frequency signal, a first matching network, and a first multi-throw switch that includes a first plurality of throws that are each configured to receive the first radio frequency signal by way of the first matching network; and
    a second transmission path including a second power amplifier configured to provide a second radio frequency signal that is within a different frequency band than the first radio frequency signal and also including a second matching network electrically coupled between an output of the second power amplifier and a second multi-throw switch, the second multi-throw switch including a second plurality of throws that are each configured to receive the second radio frequency signal by way of the second matching network, the second multi-throw switch having an input impedance configured to prevent a resonance from developing in the second transmission path due to coupling with the first transmission path when the first transmission path is active.

12. The electronic system of claim 11 wherein the input impedance of the second multi-throw switch includes a passive impedance element in series with an input shunt arm.

13. The electronic system of claim 12 wherein the passive impedance element includes a resistor.

14. The electronic system of claim 11 wherein the input impedance of the second multi-throw switch includes a shunt capacitor.

15. The electronic system of claim 11 wherein the second multi-throw switch is configured to implement at least a portion of the input impedance by having both a switch arm and a shunt arm corresponding to a selected throw on when the second multi-throw switch is in a non-active state.

16. The electronic system of claim 11 wherein each throw of the first plurality of throws is associated with a different sub-band of a defined frequency band of the first transmission path.

17. An electronic device with radio frequency signal amplification, the electronic device comprising:
    an amplifier configured to amplify a radio frequency signal;
    a matching network coupled to an output of the amplifier; and
    a select switch in communication with the amplifier by way of the matching network, the select switch configured to electrically couple an input of the select switch to a selected output path in an active state, the select switch having an input impedance in a non-active state to prevent a standing wave from resonating in matching network due to coupling to another radio frequency signal path from developing when the select switch is in the non-active state and the amplifier is deactivated.

18. The electronic device of claim 17 wherein the select switch is a multi-throw switch having a shunt arm and a switch arm corresponding to each of the throws, the select switch configured to have both the switch arm and the shunt arm corresponding to a selected throw on when the select switch is in the non-active state.

19. The electronic device of claim 18 further comprising a switch control circuit configured to provide control signals to the select switch to set the select switch in the non-active state.

20. The electronic device of claim 17 wherein the select switch includes an input shunt arm at the input of the select switch, the input shunt arm configured to be on when the select switch is in the non-active state.

21. The electronic device of claim 20 wherein a passive impedance element is in series with the input shunt arm between the input of the select switch and a ground potential.

22. The electronic device of claim 17 wherein a shunt capacitor has a first end and a second end, the first end coupled to the input of the select switch, and the second end coupled to a ground potential.

23. The electronic device of claim 17 wherein the matching network includes capacitors and inductors.

* * * * *